United States Patent
Barber et al.

(10) Patent No.: US 8,586,195 B2
(45) Date of Patent: Nov. 19, 2013

(54) METHOD FOR FORMING AN ACOUSTIC MIRROR WITH REDUCED METAL LAYER ROUGHNESS AND RELATED STRUCTURE

(75) Inventors: Bradley P. Barber, Acton, MA (US); Paul P. Gehlert, Sterling, MA (US); Christopher F. Shepard, Nashua, NH (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 587 days.

(21) Appl. No.: 12/215,950

(22) Filed: Jul. 1, 2008

(65) Prior Publication Data

US 2009/0017326 A1    Jan. 15, 2009

Related U.S. Application Data

(60) Provisional application No. 60/959,316, filed on Jul. 11, 2007.

(51) Int. Cl.
| | |
|---|---|
| *B32B 15/00* | (2006.01) |
| *B32B 5/00* | (2006.01) |
| *B05D 1/36* | (2006.01) |
| *C23C 16/06* | (2006.01) |

(52) U.S. Cl.
USPC ........... 428/621; 428/409; 428/469; 333/193; 333/195; 310/313 R; 310/313 D; 310/322; 310/324

(58) Field of Classification Search
None
See application file for complete search history.

(56) References Cited

U.S. PATENT DOCUMENTS

| | | | |
|---|---|---|---|
| 5,873,154 A | 2/1999 | Ylilammi et al. | |
| 6,204,737 B1 | 3/2001 | Ella | |
| 6,496,085 B2 | 12/2002 | Ella et al. | |
| 6,603,241 B1 | 8/2003 | Barber et al. | |
| 6,638,872 B1 * | 10/2003 | Croswell et al. | 438/695 |
| 6,720,844 B1 | 4/2004 | Lakin | |
| 6,933,807 B2 | 8/2005 | Marksteiner et al. | |
| 6,933,809 B2 | 8/2005 | Kyoung et al. | |
| 7,094,678 B2 * | 8/2006 | Bradley | 438/612 |
| 7,141,913 B2 * | 11/2006 | Shearer et al. | 310/322 |
| 7,170,215 B2 | 1/2007 | Namba et al. | |
| 7,235,915 B2 | 6/2007 | Nakamura et al. | |
| 7,328,497 B2 | 2/2008 | Barber et al. | |
| 7,414,350 B1 | 8/2008 | Barber et al. | |
| 2002/0084873 A1 | 7/2002 | Ella et al. | |
| 2002/0158702 A1 * | 10/2002 | Tikka et al. | 332/100 |
| 2004/0142497 A1 * | 7/2004 | Bradley | 438/3 |

(Continued)

OTHER PUBLICATIONS

Soukiassian et al. Applied Physics Letters. 90, 2007, p. 1-3.*

(Continued)

*Primary Examiner* — Vera Katz

(57) ABSTRACT

According to an exemplary embodiment, a method of forming a metal layer having reduced roughness includes a step of forming a seed layer over a dielectric layer. The method further includes a step of forming the metal layer over the seed layer. The seed layer causes a top surface of the metal layer to have reduced roughness. The seed layer and the metal layer can be formed in a same process chamber or in different process chambers. The dielectric layer, the seed layer, and the metal layer having reduced roughness can be utilized in an acoustic mirror structure.

5 Claims, 5 Drawing Sheets

(56) References Cited

U.S. PATENT DOCUMENTS

| | | | |
|---|---|---|---|
| 2004/0172798 A1* | 9/2004 | Ruby et al. | 29/25.35 |
| 2004/0222182 A1* | 11/2004 | Perng et al. | 216/13 |
| 2004/0227590 A1* | 11/2004 | Larson et al. | 333/189 |
| 2005/0030127 A1 | 2/2005 | Loebl et al. | |
| 2005/0088257 A1* | 4/2005 | Ruby et al. | 333/187 |
| 2005/0269900 A1* | 12/2005 | Shearer et al. | 310/311 |
| 2008/0157629 A1* | 7/2008 | Noguchi et al. | 310/313 R |
| 2008/0211352 A1 | 9/2008 | Barber et al. | |
| 2008/0241365 A1 | 10/2008 | Barber et al. | |

OTHER PUBLICATIONS

Lanz, et al. "Properties of Sputter Deposited AiN, Mo, W and SiO2 Thin-Films for Bulk-Acoustic-Wave Application on 200mm Si Substrates," The Eighth International Symposium on Sputtering and Plasma Process, 2005.

* cited by examiner

-Prior Art-

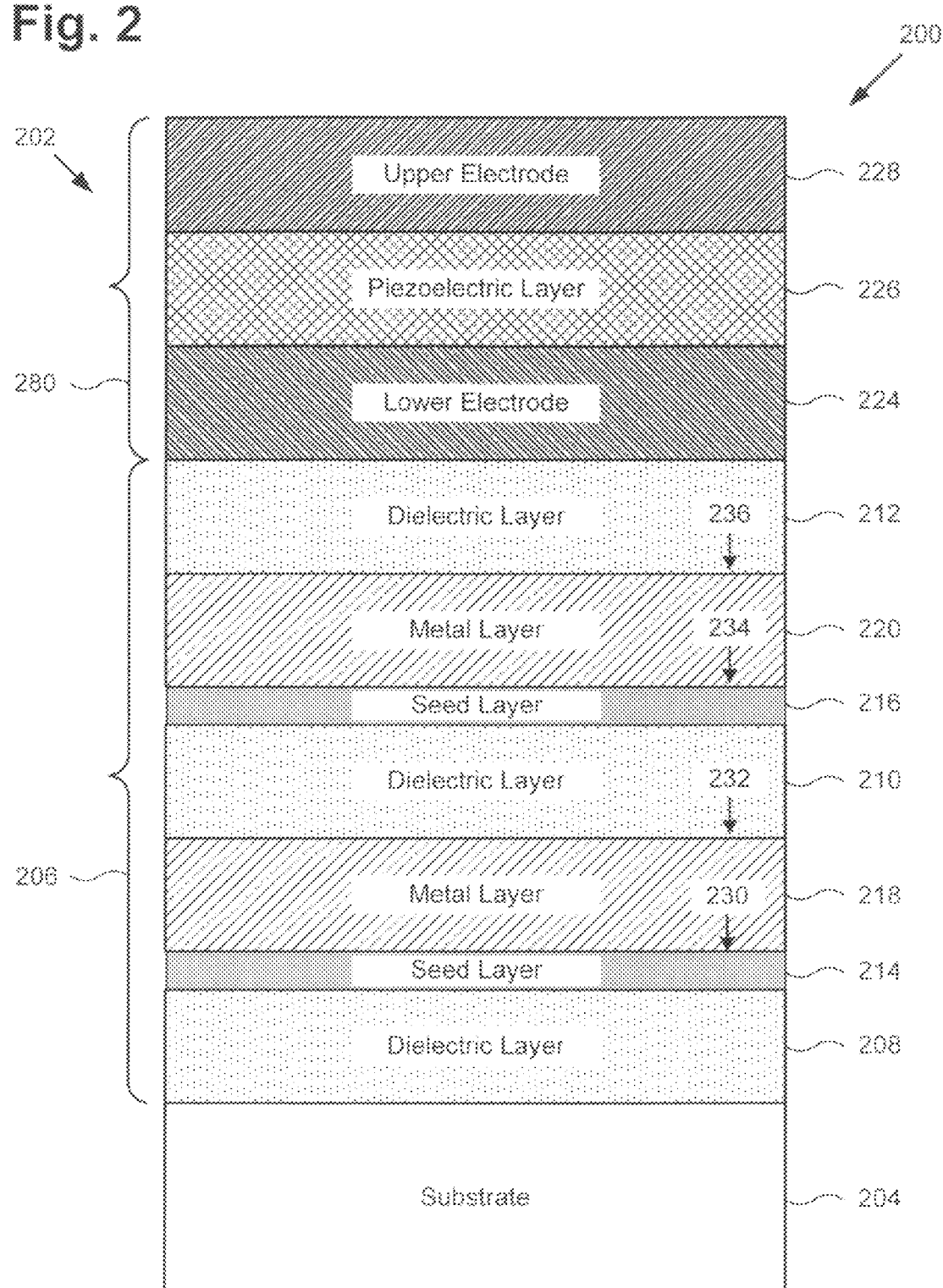

METHOD FOR FORMING AN ACOUSTIC MIRROR WITH REDUCED METAL LAYER ROUGHNESS AND RELATED STRUCTURE

The present application claims the benefit of and priority to a pending provisional patent application entitled "Method for Forming an Improved Acoustic Mirror and Related Structure," Ser. No. 60/959,316 filed on Jul. 11, 2007. The disclosure in that pending provisional application is hereby incorporated fully by reference into the present application.

BACKGROUND OF THE INVENTION

1. Field of the Invention

The present invention generally relates to the field of semiconductor fabrication. More particularly, the invention relates to the fabrication of acoustic wave structures in semiconductor dies.

2. Background Art

Bulk acoustic wave (BAW) structures, which can be used in frequency control or filtering applications, can include a piezoelectric layer sandwiched between upper and lower electrodes and an underlying acoustic mirror structure. The acoustic mirror structure, which can include a number of alternating dielectric and metal layers, can be used to trap acoustic energy in the piezoelectric layer by reflecting acoustic energy. However, roughness at the interfaces between the layers of the acoustic mirror structure can reduce the effectiveness of the acoustic mirror structure by causing energy loss through acoustic wave scattering, which can be particularly detrimental in the gigahertz (GHz) frequency operating range. Thus, it is important that the acoustic mirror structure be fabricated such that each layer is as smooth as possible.

Conventional solutions for reducing roughness include polishing the mirror layers as they are deposited or polishing the top layer of the final acoustic mirror structure. However, polishing to a required level of smoothness can be difficult and can require expensive processing equipment. Also, since it is important in BAW structures to have repeatable acoustic mirror thicknesses so as to provide repeatable operating frequencies, the difficulty of repeatedly polishing materials at a fixed rate can cause the layer thickness to be changed in an uncontrolled and non-uniform manner. As a result, BAW structure performance and yield can be undesirably reduced.

SUMMARY OF THE INVENTION

A method for forming an acoustic mirror with reduced metal layer roughness and related structure, substantially as shown in and/or described in connection with at least one of the figures, as set forth more completely in the claims.

BRIEF DESCRIPTION OF THE DRAWINGS

FIG. 2 illustrates a cross-sectional view of an exemplary bulk acoustic wave structure including an exemplary acoustic mirror structure in accordance with one embodiment of the present invention.

DETAILED DESCRIPTION OF THE INVENTION

The present invention is directed to a method for forming an acoustic mirror with reduced metal layer roughness and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

As will be discussed in detail below, the present invention provides an innovative method for reducing surface roughness in a metal layer of an acoustic mirror structure, such as an acoustic mirror structure utilized in a BAW (bulk acoustic wave) resonator. However, the invention can be generally applied to reduce surface roughness in any metal layer overlying a dielectric, such as silicon oxide, in a semiconductor structure. Reducing metal roughness in other semiconductor structures can be beneficial in several ways. Smoother metal surfaces reduce electrical resistance in the metal layer, especially if the electrical signals are in the RF frequency range. Reduced roughness of metal films can also beneficially increase the electrical breakdown voltage of a structure such as a capacitor containing a dielectric layer sandwiched between such metal layers. Additionally, a smoother metal surface can reduce electromigration of the metal due to reduced electron scattering compared to a rougher metal interface.

Figure 1:
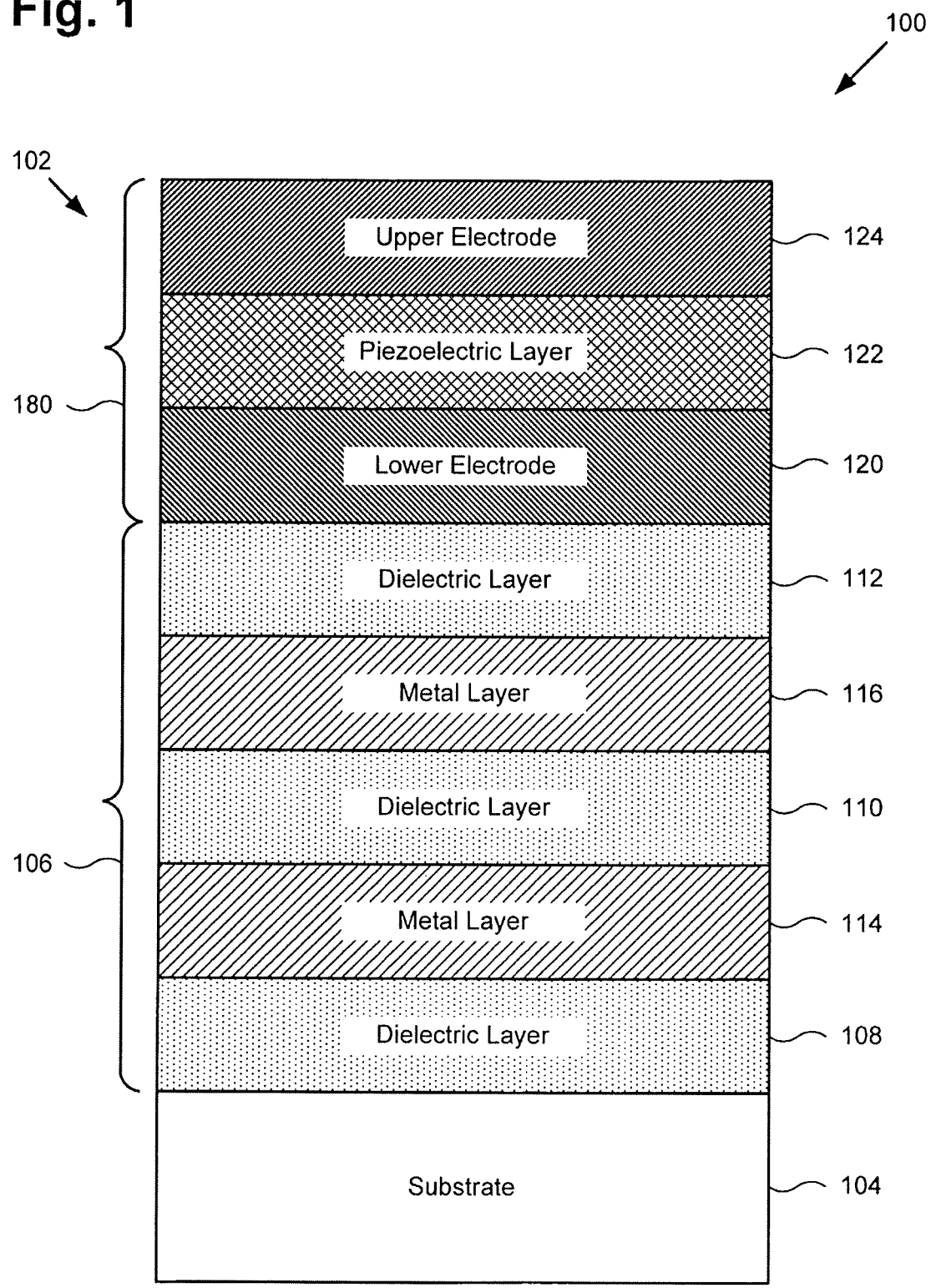
FIG. 1 illustrates a cross-sectional view of an exemplary bulk acoustic wave structure including a conventional exemplary acoustic mirror structure.

FIG. 1 shows a cross-sectional view of a semiconductor die including a conventional exemplary acoustic mirror in an exemplary BAW structure. In FIG. 1, structure 100 includes BAW structure 102 on substrate 104. BAW structure 102 includes conventional acoustic mirror structure 106, which includes dielectric layers 108, 110, and 112, and metal layers 114 and 116, and resonator structure 180, which includes lower electrode 120, piezoelectric layer 122, and upper electrode 124. BAW structure 102 can be used in a BAW filter, such as a BAW radio frequency (RF) filter, or as a resonator in a frequency control circuit, for example.

As shown in FIG. 1, dielectric layer 108 is situated over substrate 104, which can be a silicon substrate, metal layer 114 is situated over dielectric layer 108, dielectric layer 110 is situated over metal layer 114, metal layer 116 is situated over dielectric layer 110, and dielectric layer 112 is situated over metal layer 116. Dielectric layers 108, 110, and 112, which are low acoustic impedance layers, can each comprise silicon dioxide ($SiO_2$), which is also referred to as "silicon oxide," and can each have a thickness of between 0.25 microns and 2.0 microns in one embodiment. Dielectric layers 108, 110, and 112 can each be formed by using a chemical vapor deposition (CVD) process or other suitable deposition process. Metal layers 114 and 116, which are high acoustic impedance layers, can each comprise tungsten (W) or other suitable high density metal and can each have a thickness of between 0.25 microns and 2.0 microns in one embodiment. Metal layers 114 and 116 can each be formed by using a physical vapor deposition (PVD) process, which is also known as a sputter deposition process, or other suitable deposition process.

Also shown in FIG. 1, lower electrode 120 is situated over dielectric layer 112, piezoelectric layer 122 is situated over lower electrode 120, and upper electrode 124 is situated over piezoelectric layer 122. Lower electrode 120 and upper electrode 124 can each comprise molybdenum (Mo) or other suitable metal having a high density and sufficiently high conductivity and can be formed by using a PVD process or other suitable deposition process. Piezoelectric layer 122 can comprise aluminum nitride (AlN), zinc oxide (ZnO), or other suitable piezoelectric material and can be formed by using a PVD process or other suitable deposition process.

The operation of BAW structure 102 will now be discussed. When an electric field is applied across piezoelectric layer 122 via upper electrode 124 and lower electrode 120 in resonator structure 180, electrical energy is converted into acoustic energy in piezoelectric layer 122 through electromechanical coupling, thereby causing piezoelectric layer 122 to vibrate. As a result, piezoelectric layer 122 can generate acoustic waves that can propagate in a longitudinal mode, i.e., in a direction perpendicular to the top surface of piezoelectric layer 122.

Conventional acoustic mirror structure 106 is utilized in BAW structure 102 to reflect acoustic energy back into resonator structure 180, thereby preventing a loss of acoustic energy through transmission into substrate 104. However, roughness at the interfaces between metal and dielectric layers (e.g. between metal layer 114 and dielectric layer 110) in conventional acoustic mirror structure 106 can cause a loss of acoustic energy through scattering, which can reduce the performance of BAW structure 102. Roughness at a top surface of a metal layer, such as metal layer 114, can result from the deposition of a metal, such as tungsten, on a dielectric material, such as silicon oxide. When a metal is deposited on silicon oxide, an oxide of that metal can tend to initially form on the silicon oxide, which can cause the top surface of resulting metal layer to have increased roughness.

Also, the roughness at the interfaces between metal and dielectric layers in conventional acoustic mirror structure 106 can propagate through the acoustic mirror structure and increase the roughness of the surface on which piezoelectric layer 122 is grown. If piezoelectric layer 122 is grown on a rough surface, the grains are typically not aligned in a substantially parallel orientation, which can undesirably reduce electromechanical coupling. Additionally, if the grains are not aligned substantially perpendicular to the underlying surface, unwanted types of acoustic waves can be excited, which can undesirably reduce the performance of BAW structure 102.

The roughness at the interfaces between metal and dielectric layers in conventional acoustic mirror structure 106 can be reduced by polishing each layer after it has been deposited by using, for example, a chemical mechanical polishing (CMP) process. However, polishing to a required Angstrom level of smoothness can be difficult and can require expensive processing equipment. Also, polishing can cause the thickness of each layer to be changed in an uncontrolled and non-uniform manner, thereby undesirably affecting the performance of the conventional acoustic mirror structure and, consequently, the performance of BAW structure 102.

FIG. 2 shows a cross-sectional view of a semiconductor die including an exemplary acoustic mirror in an exemplary BAW structure in accordance with one embodiment of the present invention. Certain details and features have been left out of FIG. 2, which are apparent to a person of ordinary skill in the art. In FIG. 2, structure 200 includes BAW structure 202 on substrate 204. BAW structure 202 includes acoustic mirror structure 206, which includes dielectric layers 208, 210, and 212, seed layers 214 and 216, and metal layers 218 and 220, and resonator structure 280, which includes lower electrode 224, piezoelectric layer 226, and upper electrode 228. Thus, in the present embodiment, acoustic mirror structure 206 includes three dielectric layers, which are low acoustic impedance layers, and two metal layers, which are high acoustic impedance layers. In other embodiments, acoustic mirror structure 206 may include a different number of dielectric layers and a different number of metal layers disposed in an alternating dielectric layer/metal layer arrangement. BAW structure 202 can be used in a BAW filter, such as a BAW RF filter, or as a resonator in a frequency control circuit, for example.

As shown in FIG. 2, dielectric layer 208 is situated over substrate 204, which can be a silicon substrate, seed layer 214 is situated over dielectric layer 208, and metal layer 218 is situated over seed layer 214. Dielectric layer 208 can comprise silicon oxide or other suitable dielectric material and can have a thickness of, for example, between 0.25 microns and 2.0 microns in one exemplary embodiment. Dielectric layer 208 can be formed by depositing a layer of silicon oxide over substrate 204 by using a CVD process or other suitable deposition process. Seed layer 214 can comprise tungsten nitride and can have a thickness of, for example, between 50.0 Angstroms and 250.0 Angstroms in one exemplary embodiment. In one embodiment, seed layer 214 can comprise aluminum nitride or other suitable metallic compound material. Seed layer 214 can be formed, for example, by depositing a layer of tungsten nitride over dielectric layer 208 by using a PVD process or other suitable deposition process.

Metal layer 218 can comprise tungsten and can have a thickness of between 0.25 microns and 2.0 microns in one embodiment. In one embodiment, metal layer 218 can comprise a suitable high density metal other than tungsten. Metal layer 218 can be formed, for example, by depositing a layer of tungsten over seed layer 214 by using a PVD process or other suitable deposition process. In the present embodiment, metal layer 218 and seed layer 214 can be formed in the same process chamber by using a PVD process or other suitable deposition process. During the deposition process, argon gas and nitrogen gas can be initially supplied to a process chamber including a plasma for depositing a layer of tungsten nitride over dielectric layer 208. After a relatively short time period of, for example, between approximately 2.0 seconds and approximately 30.0 seconds in one embodiment, the supply of nitrogen gas can be cut off from the process chamber to complete the formation of the tungsten nitride layer.

In one embodiment, the nitrogen gas can be supplied to the process chamber for approximately 10.0 seconds to form the tungsten nitride layer. After the tungsten nitride layer has been deposited over dielectric layer 208 to form seed layer 214, a substantially pure layer of tungsten can be deposited over the seed layer in the same process chamber. Since some nitrogen gas can remain in the process chamber for a short time after the nitrogen gas supply has been cut off to the process chamber, the interface between seed and metal layers (i.e. interface 230) can form a gradual transition between seed layer 214 and metal layer 218. In another embodiment, metal layer 218 can be formed in a different process chamber than seed layer 214. In that embodiment, seed layer 214 can comprise a compound that does not comprise the same metal as in metal layer 218. For example, seed layer 214 can comprise aluminum nitride and metal layer 218 can comprise tungsten. In an embodiment in which seed layer 214 and metal layer 218 are formed in different process chambers, interface 230 can form an abrupt transition between seed layer 214 and metal layer 218.

By forming metal layer 218 on seed layer 214, top surface 232 of metal layer 218 has a reduced roughness. For example, top surface 232 can have an approximate 50.0 percent reduction in roughness compared to the top surface of a metal layer, such as metal layer 114, in conventional acoustic mirror structure 106, wherein the metal layer is not formed over a seed layer. Seed layer 214 can cause metal layer 218 to have a reduced top surface roughness by preventing oxide in dielectric layer 208 from reacting with the metal layer and forming metal oxide when it (i.e. the metal layer) is deposited.

Also shown in FIG. 2, dielectric layer 210 is situated over metal layer 218, seed layer 216 is situated over dielectric layer 210, metal layer 220 is situated over seed layer 216, and dielectric layer 212 is situated over metal layer 220. Dielectric layers 210 and 212 are each substantially similar in composition and purpose to dielectric layer 208 though its thickness may be somewhat different from layer 208 as required for proper operation of the acoustic mirror. Dielectric layer 210 can be formed by depositing a layer of silicon oxide on metal layer 218 by using a CVD process or other suitable deposition process. Seed layer 216 is substantially similar in composition and thickness to seed layer 214 and metal layer 220 is substantially similar in composition and purpose to metal layer 218 though again its thickness may be somewhat different as required for optimal mirror function. In the present embodiment, seed layer 216 and metal layer 220 can be formed in the same process chamber in a similar manner as seed layer 214 and metal layer 218 as discussed above. Thus, interface 234 can form a gradual transition between seed layer 216 and metal layer 220.

In another embodiment, seed layer 216 and metal layer 220 can comprise different materials and can be formed in different process chambers. In that embodiment, interface 234 can form an abrupt transition between seed layer 216 and metal layer 220. By forming metal layer 220 on seed layer 216, top surface 236 of metal layer 220 has a reduced roughness compared to a metal layer, such as metal layer 116, in conventional acoustic mirror structure 106 in FIG. 1. Dielectric layer 212 can be formed by, for example, depositing a layer of silicon oxide on metal layer 220 by using a CVD process or other suitable deposition process.

Further shown in FIG. 2, lower electrode 224 is situated over dielectric layer 212, piezoelectric layer 226 is situated over lower electrode 224, and upper electrode 228 is situated over piezoelectric layer 226. Lower electrode 224 and upper electrode 228 can each comprise molybdenum or other suitable metal having a high density and sufficiently high conductivity and piezoelectric layer 226 can comprise aluminum nitride, zinc oxide, or other suitable piezoelectric material. Lower electrode 224 can be formed by, for example, depositing a layer of molybdenum on dielectric layer 212 by using a PVD process or other suitable deposition process. Piezoelectric layer 226 can be formed, for example, by depositing a layer of aluminum nitride over lower electrode 224 by using a CVD process or other suitable deposition process. Upper electrode 228 can be formed by, for example, depositing a layer of molybdenum over piezoelectric layer 226 by using a CVD process or other suitable deposition process.

The operation of BAW structure 202 will now be discussed. When an electric field is applied across piezoelectric layer 226 via upper electrode 228 and lower electrode 224 in resonator structure 280, electrical energy is converted into acoustic energy in piezoelectric layer 226 through electromechanical coupling, thereby causing piezoelectric layer 226 to vibrate. As a result, piezoelectric layer 226 can generate acoustic waves that can propagate in a longitudinal mode. Similar to conventional acoustic mirror structure 106 in BAW structure 102, acoustic mirror structure 206 is utilized in BAW structure 202 to reflect acoustic energy back into resonator structure 280, thereby preventing a loss of acoustic energy through transmission into substrate 204. The number of alternating dielectric and metal layers in acoustic mirror structure 206 can be selected to achieve a desired percentage of acoustic energy reflection.

However, by forming metal layers 218 and 220 over respective seed layers 214 and 216, an embodiment of the invention's acoustic mirror structure 206 provides metal layers having reduced top surface roughness compared to the metal layers in conventional acoustic mirror structure 106 in FIG. 1. As a result, the invention provides an acoustic mirror structure having reduced acoustic energy loss and, consequently, increased performance compared to conventional acoustic mirror structure 106. Also, the reduced metal layer roughness in acoustic mirror structure 206 causes lower and upper electrodes 224 and 228 and piezoelectric layer 226 to have smoother surfaces, which advantageously increases the performance of BAW structure 202. Different methods of fabricating seed and metal layers in the invention's acoustic mirror structure are further discussed below in relation to FIGS. 3A and 3B and FIG. 4.

Figure 3A:
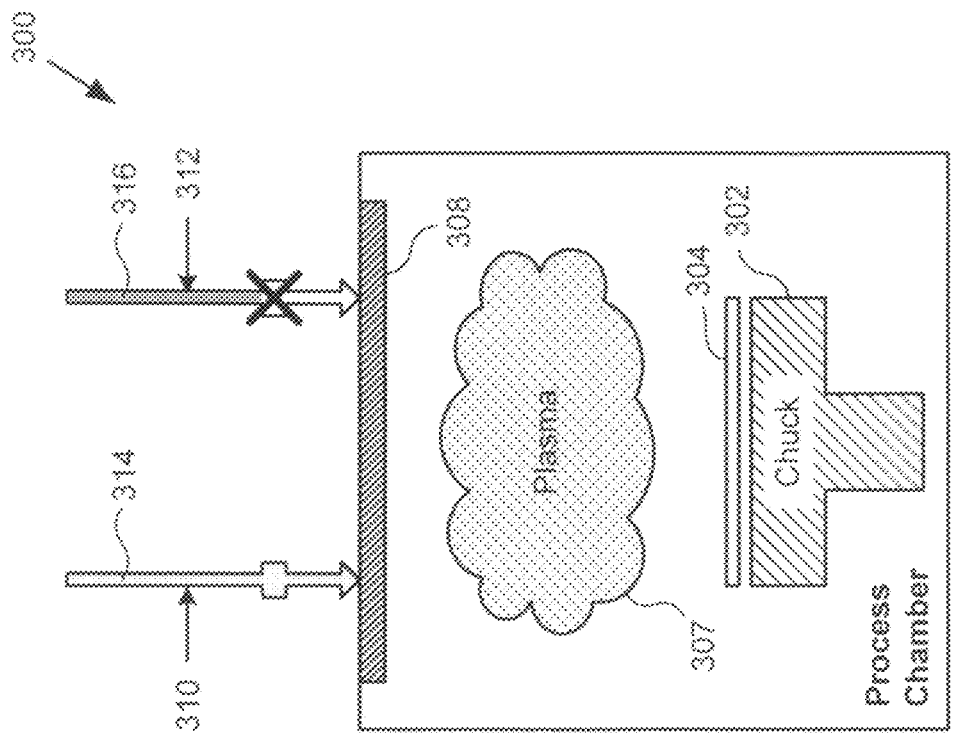
FIG. 3A is a diagram of an exemplary process chamber during formation of an exemplary seed layer in accordance with one embodiment of the present invention.

FIG. 3A shows a diagram of a process chamber during formation of an exemplary seed layer in accordance with one embodiment of the present invention. Certain details and features have been left out of FIG. 3A, which are apparent to a person of ordinary skill in the art. In FIG. 3A, process chamber 300 is shown during the formation of a seed layer, such as seed layer 214 in FIG. 2, for an embodiment of the invention's acoustic mirror structure, such as acoustic mirror structure 206. Process chamber 300 includes chuck 302, wafer 304, plasma 306, metal target 308, and gas input lines 310 and 312. Process chamber 300 can be utilized for performing, for example, a PVD process.

As shown in FIG. 3A, wafer 304 is mounted on chuck 302, which can be, for example, an electrostatic chuck. Wafer 304 can include a silicon substrate, such as substrate 204, and an overlying dielectric layer, such as dielectric layer 208. Also shown in FIG. 3A, plasma 306 is formed between wafer 304 and metal target 308 and can comprise argon and nitrogen ions. In the present embodiment, metal target 308 can comprise tungsten and can be electrically negative compared to wafer chuck 302 and the walls of chamber 300. Further shown in FIG. 3A, gas input lines 310 and 312 are connected to process chamber 300 and can supply respective gases 314 and 316. In the present embodiment, gas 314 can be argon and gas 316 can be nitrogen.

During the formation of a seed layer, such as seed layer 214 or 216 in acoustic mirror structure 206, in the embodiment in FIG. 3A, argon and nitrogen gases are supplied to process chamber 300. Plasma 306, which is formed in process chamber 300, includes argon and nitrogen ions. The argon ions, which have a positive charge, are accelerated toward the negatively charged tungsten target, thereby dislodging tungsten molecules in a scattering process. The tungsten molecules can combine with the nitrogen atoms to form a seed layer of tungsten nitride on the surface of wafer 304. The nitrogen gas can be applied to process chamber 300 for a period of time of between 2.0 seconds and 30.0 seconds, in one embodiment, to form the tungsten nitride seed layer, which can have a thickness of, for example, between 50.0 Angstroms and 250.0 Angstroms in one exemplary embodiment.

Figure 3B:
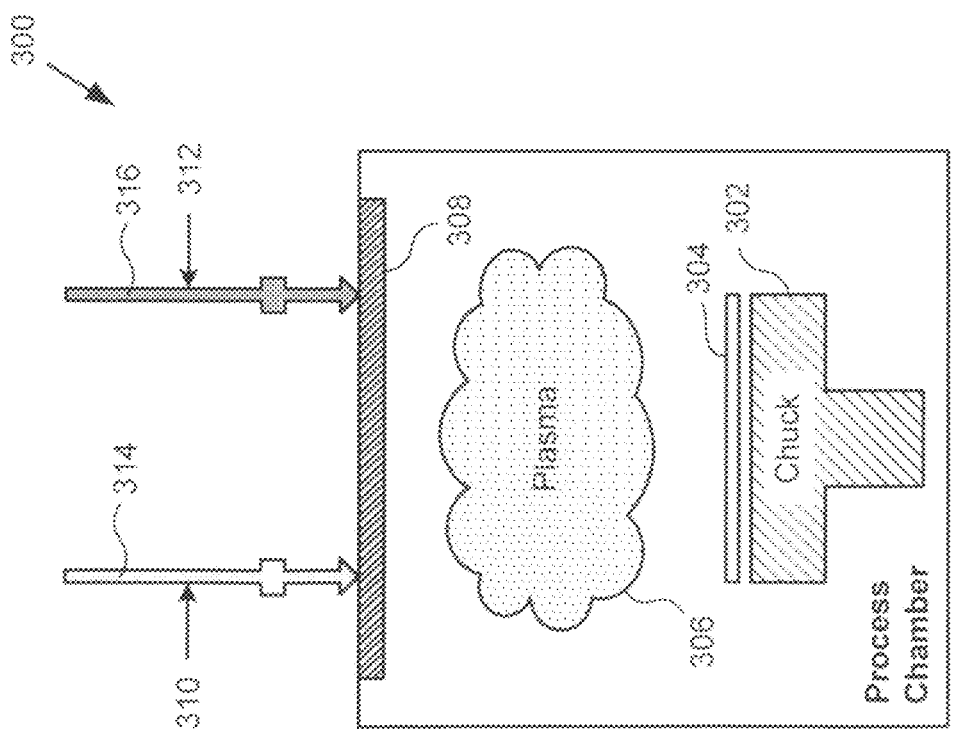
FIG. 3B is a diagram of the exemplary process chamber of FIG. 3A during formation of an exemplary metal layer on an exemplary seed layer in accordance with one embodiment of the present invention.

FIG. 3B shows a diagram of process chamber 300 in FIG. 3A during formation of an exemplary metal layer according to one embodiment of the present invention. Chuck 302, wafer 304, metal target 308, gas input lines 310 and 312, and gases 314 and 316 refer to the same elements in FIG. 3A and FIG. 3B. In FIG. 3B, process chamber 300 is shown during the formation of a metal layer, such as metal layer 218 or 220 in FIG. 2, immediately after the formation of a seed layer on wafer 304. After the seed layer, which can comprise tungsten nitride, has been formed, gas 316, which can comprise nitrogen, in gas input line 312 is cut off. After the nitrogen ions remaining in process chamber 300 have been depleted, the resulting plasma (i.e. plasma 307) in process chamber 300 includes argon ions without a significant amount of nitrogen ions. As a result, the argon ions will strike the tungsten target (i.e. metal target 308) and dislodge tungsten molecules, which are deposited on wafer 304 to form a substantially pure layer of tungsten on the previously deposited tungsten nitride seed layer.

By forming a layer of metal, such as tungsten, on the seed layer, the top surface of the metal layer has a reduced roughness compared to a layer of metal, such as tungsten, formed directly on a dielectric, such as silicon oxide, in conventional acoustic mirror structure 106 in FIG. 1. Thus, in the embodiment of the invention in FIGS. 3A and 3B, a metal layer, such as tungsten, is deposited on a seed layer, such as tungsten nitride, where the metal layer and the seed layer are sequentially deposited in the same process chamber in a continuous deposition process, such as a continuous PVD process to advantageously achieved a metal layer with reduced top surface roughness.

Figure 4:
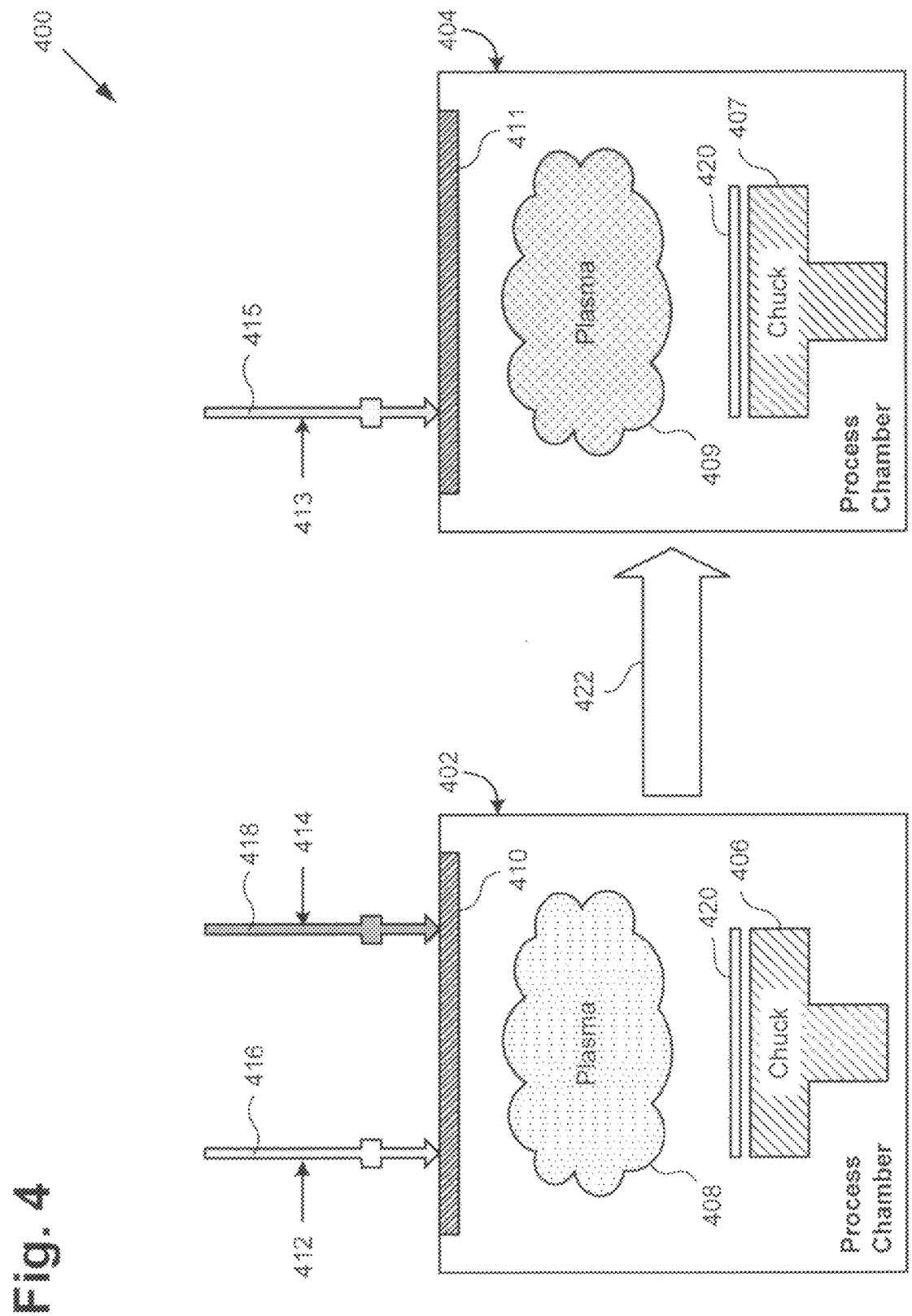
FIG. 4 is a diagram of a wafer processing system including two process chambers for forming an exemplary seed layer and an overlying exemplary metal layer in accordance with one embodiment of the present invention.

FIG. 4 shows a diagram of a wafer processing system including two process chambers for forming respective exemplary seed and metal layers in accordance with one embodiment of the present invention. Certain details and features have been left out of FIG. 4, which are apparent to a person of ordinary skill in the art. Wafer processing system 400 includes process chamber 402, which includes chuck 406, plasma 408, metal target 410, and gas input lines 412 and 414, and process chamber 404, which includes chuck 407, plasma 409, metal target 411, and gas input line 413. Although wafer 420 is shown in process chamber 402 and in process chamber 404 in FIG. 4, wafer 420 will reside in process chamber 402 for deposition of a seed layer and will be transferred to process chamber 404 (as indicated by arrow 422) for deposition of a metal layer on the seed layer.

As shown in FIG. 4, in process chamber 402, wafer 420 is mounted on chuck 406, which can be, for example, an electrostatic chuck, and plasma 408 is formed between wafer 420 and metal target 410, which can be electrically negative with respect to chuck 406 and the walls of chamber 402. Wafer 420 can include a silicon substrate, such as substrate 204 in FIG. 2, and an overlying dielectric layer, such as dielectric layer 208. In the embodiment in FIG. 4, plasma 408 can comprise argon and nitrogen ions. In another embodiment, plasma 408 can comprise a different combination of ions. In the embodiment in FIG. 4, metal target 410 can comprise aluminum. In another embodiment, metal target 410 can comprise a metal other than aluminum. Also shown in FIG. 4, gas input lines 412 and 414 are connected to process chamber 402 and can supply respective gases 416 and 418. In the embodiment in FIG. 4, gases 416 and 418 can be argon and nitrogen, respectively.

Further shown in FIG. 4, in process chamber 404, wafer 420 is mounted on chuck 407, which can be, for example, an electrostatic chuck, and plasma 409 is formed between wafer 420 and metal target 411, which can be electrically negative with respect to chuck 407 and the walls of chamber 404. Plasma 409 can comprise, for example, argon ions in one embodiment. In the embodiment in FIG. 4, metal target 411 can comprise tungsten. In one embodiment, metal target 411 can comprise a metal other than tungsten. Also shown in FIG. 4, gas input line 413 is connected to process chamber 404 and can supply gas 415, which can be, for example, argon.

In the embodiment in FIG. 4, process chamber 402 is utilized to deposit a seed layer, such as seed layer 214 or 216 in FIG. 2, comprising aluminum nitride on a dielectric layer, such as dielectric layer 208 or 210, on wafer 420. The layer of aluminum nitride (i.e. the seed layer) can be deposited on wafer 420 by utilizing nitrogen and argon ions, which have a positive charge, in plasma 408 to dislodge aluminum atoms in the aluminum target (i.e. metal target 410) in a scattering process. The dislodged aluminum atoms can combine with the nitrogen ions in plasma 408 to form a layer of aluminum nitride on the surface of wafer 420.

After the seed layer comprising aluminum nitride has been deposited on wafer 420 in process chamber 402, wafer 420 is transferred, as indicated by arrow 422, to process chamber 404. Process chamber 404 is utilized to deposit a metal layer, such as metal layer 218 or 220, comprising tungsten on the seed layer that was formed on wafer 420 in process chamber 402. The layer of tungsten can be deposited on the seed layer on wafer 420 by utilizing positively charged argon ions in plasma 409 to dislodge tungsten atoms in the tungsten target (i.e. metal target 411) in a scattering process. The dislodged tungsten atoms can form a layer of tungsten on the seed layer previously deposited on wafer 420.

Thus, in the embodiment of the invention shown in FIG. 4, a metal layer, such as tungsten, is deposited on a seed layer, such as aluminum nitride, where the metal layer and the seed layer are deposited in different process chambers. By forming a metal layer on a seed layer, the embodiment of the invention in FIG. 4 advantageously provides a metal layer with a top surface having reduced roughness.

Figure 5:
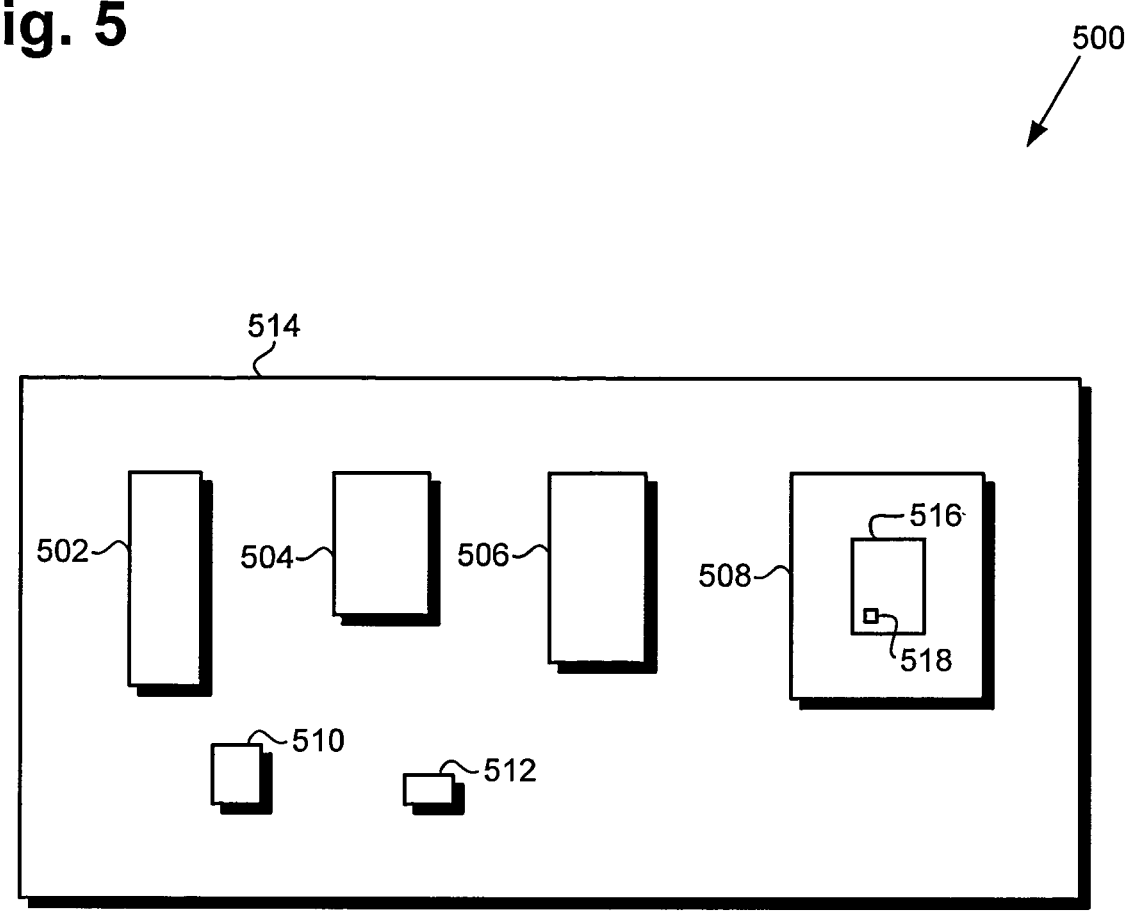
FIG. 5 is a diagram of an exemplary electronic system including an exemplary chip or die utilizing an acoustic mirror structure in accordance with one embodiment of the present invention.

FIG. 5 illustrates a diagram of an exemplary electronic system including an exemplary chip or die utilizing one or more acoustic mirror structures in accordance with one embodiment of the present invention. Electronic system 500 includes exemplary modules 502, 504, and 506, IC chip or semiconductor die 508, discrete components 510 and 512, residing in and interconnected through circuit board 514. In one embodiment, electronic system 500 may include more than one PCB. IC chip 508 includes circuit 516, which can comprise a BAW filter, including one or more of the invention's acoustic mirror structures designated by numeral 518.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can be, for example, any chip utilizing one or more of an embodiment of the invention's acoustic mirror structures, such as acoustic mirror structure 206 in FIG. 2. In one embodiment, IC chip 508 may not be mounted on circuit board 514, and may be interconnected with other modules on different circuit boards. As stated above, circuit 516 is situated in IC chip 508 and can comprise a BAW filter including one or more of the invention's acoustic mirror structures designated by numeral 518. Further shown in FIG. 5, discrete components 510 and 512 are mounted on circuit board 514 and can each be, for example, a discrete filter, such as one including a SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a cell phone, a switching device, a router, a repeater, a codec, a wired or wireless LAN, a WLAN, a Bluetooth enabled device, a Global Positioning System (GPS) device, a computer, a monitor, a television set, a satellite set top box, a cable modem, a printer, a copier, an RF transceiver, a personal digital assistant (PDA), or in any other kind of system, device, component or module utilized in modern electronics applications.

In addition to forming metal layers having reduced top surface roughness in an acoustic mirror structure, the invention can be generally applied to achieve reduced surface roughness of a metal layer formed on a dielectric layer. For example, the invention can be applied to reduce surface roughness of metal plates in a capacitor, such as a metal-insulator-metal (MIM) capacitor in a semiconductor die.

Thus, as discussed above, by forming metal layers over respective seed layers in an acoustic mirror structure, the present invention provides metal layers having reduced top surface roughness compared to metal layers in a conventional acoustic mirror structure. As a result, the invention advantageously achieves an acoustic mirror structure having reduced acoustic energy loss and, consequently, increased performance. In one embodiment of the invention, a seed layer and an overlying metal layer are formed in a continuous deposition process performed in the same process chamber. In another embodiment, the seed layer can be depositing in a first process chamber and a metal layer can be deposited on the seed layer in a second process chamber.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An apparatus, comprising:
an acoustic mirror comprising: a first dielectric layer disposed over a substrate; a first seed layer disposed over said first dielectric layer; a first metal layer having a top surface, said first metal layer being disposed over said first seed layer; wherein said first seed layer causes said top surface of said first metal layer to have a reduced roughness;
a lower electrode disposed over the acoustic mirror; a piezoelectric layer disposed over the lower electrode; and an upper electrode disposed over the piezoelectric layer.

2. The apparatus of claim 1, wherein an interface between said first seed layer and said first metal layer forms a gradual transition between said first seed layer and said first metal layer.

3. The apparatus of claim 1, wherein said first seed layer comprises a compound comprising a same metal in said metal layer.

4. The apparatus of claim 1, wherein said first seed layer comprises a compound not comprising a same metal in said metal layer.

5. The apparatus of claim 1 further comprising: a second dielectric layer situated over first metal layer; a second seed layer situated over said second dielectric layer; a second metal layer situated over said second seed layer.

\* \* \* \* \*